(12) United States Patent
Zang et al.

(10) Patent No.: US 8,952,552 B2
(45) Date of Patent: Feb. 10, 2015

(54) SEMICONDUCTOR PACKAGE ASSEMBLY SYSTEMS AND METHODS USING DAM AND TRENCH STRUCTURES

(75) Inventors: Ruey Kae Zang, San Diego, CA (US); Wen-Sung Hsu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 585 days.

(21) Appl. No.: 12/621,839

(22) Filed: Nov. 19, 2009

(65) Prior Publication Data

US 2011/0115083 A1    May 19, 2011

(51) Int. Cl.
    *H01L 23/48*    (2006.01)
    *H01L 23/52*    (2006.01)
    *H01L 29/40*    (2006.01)
    *H01L 23/28*    (2006.01)
    *H01L 21/56*    (2006.01)

(52) U.S. Cl.
    CPC ..... *H01L 21/563* (2013.01); *H01L 2224/16225* (2013.01); *H01L 2224/26175* (2013.01); *H01L 2224/32225* (2013.01); *H01L 2224/73204* (2013.01); *H01L 2224/83385* (2013.01); *H01L 2924/15311* (2013.01)
    USPC ........... 257/782; 257/737; 257/778; 257/783; 257/787

(58) Field of Classification Search
    CPC ........... H01L 2224/16225; H01L 2224/32225; H01L 2224/73204; H01L 2924/15311; H01L 2924/00; H01L 2924/00012; H01L 21/563; H01L 2224/26175; H01L 2224/83385; H01L 2224/83051; H01L 2251/105; H01L 21/475; H01L 21/0268; H01L 21/31; H01L 23/3157
    USPC .................. 257/667, 783, 737, 778, 782, 787
    See application file for complete search history.

(56) References Cited

U.S. PATENT DOCUMENTS

| | | | | |
|---|---|---|---|---|
| 5,311,060 A | * | 5/1994 | Rostoker et al. | 257/796 |
| 6,614,122 B1 | * | 9/2003 | Dory et al. | 257/787 |
| 6,853,089 B2 | * | 2/2005 | Ujiie et al. | 257/783 |
| 7,255,823 B1 | * | 8/2007 | Guenther et al. | 264/263 |
| 7,359,211 B2 | * | 4/2008 | Landeros et al. | 361/760 |
| 7,804,161 B2 | * | 9/2010 | Saeki | 257/667 |
| 7,808,113 B2 | * | 10/2010 | Gallegos | 257/778 |
| 7,851,345 B2 | * | 12/2010 | Shim et al. | 438/612 |
| 8,344,360 B2 | * | 1/2013 | Auch et al. | 257/40 |
| 8,349,721 B2 | * | 1/2013 | Shim et al. | 438/612 |
| 2002/0090805 A1 | * | 7/2002 | Yap et al. | 438/615 |
| 2005/0195582 A1 | * | 9/2005 | Landeros et al. | 361/760 |

(Continued)

FOREIGN PATENT DOCUMENTS

| | | | | |
|---|---|---|---|---|
| CN | 100508177 C | 7/2009 | | |
| DE | 102006010511 A1 | 9/2007 | | |
| JP | 04254358 A | * | 9/1992 | H01L 23/28 |

OTHER PUBLICATIONS

International Search Report and Written Opinion—PCT/US2010/057307, International Search Authority—European Patent Office—Mar. 1, 2011.

*Primary Examiner* — Teresa M Arroyo
(74) *Attorney, Agent, or Firm* — Michelle S. Gallardo (57) ABSTRACT

A packaging system for preventing underfill overflow includes a package substrate having a solder mask a die attach site, a solder mask dam on the solder mask proximal to the die attach site, and a trench in the solder mask proximal to the die attach site. The trench and the solder mask dam are adapted to constrain flow of an underfill material.

12 Claims, 5 Drawing Sheets

(56) References Cited

U.S. PATENT DOCUMENTS

| | | | |
|---|---|---|---|
| 2005/0287702 A1* | 12/2005 | Victor Tan et al. | 438/106 |
| 2007/0045870 A1 | 3/2007 | Kuramochi | |
| 2008/0150099 A1* | 6/2008 | Landeros et al. | 257/666 |
| 2008/0179383 A1* | 7/2008 | Sakurai et al. | 228/208 |
| 2008/0237892 A1 | 10/2008 | Saeki | |
| 2008/0237895 A1* | 10/2008 | Saeki | 257/787 |
| 2009/0001606 A1* | 1/2009 | Tamadate | 257/778 |
| 2009/0154128 A1 | 6/2009 | Tamadate | |
| 2009/0250810 A1* | 10/2009 | Pendse | 257/723 |
| 2010/0007015 A1* | 1/2010 | Gallegos | 257/737 |
| 2010/0007032 A1* | 1/2010 | Gallegos | 257/777 |
| 2010/0320581 A1* | 12/2010 | Saeki | 257/678 |

* cited by examiner

SEMICONDUCTOR PACKAGE ASSEMBLY SYSTEMS AND METHODS USING DAM AND TRENCH STRUCTURES

TECHNICAL FIELD

The present description generally relates to semiconductor chip packaging and, more specifically, to techniques using a dam and a trench to control flow of underfill.

BACKGROUND

Semiconductor chip packages are used in a variety of devices and conventionally include a package substrate and one or more dies mounted on the package substrate. Semiconductor chip packages sometimes include underfill to provide thermal and mechanical support to the die on the package substrate. For instance, in a conventional design using a flip chip ball grid array die, underfill is applied, as a liquid, between the die and the substrate, thereby filling in the spaces within the ball grid array. The underfill then hardens.

It is not desirable for underfill to flow onto some parts of the package substrate. For example, when underfill flows onto an exposed electrical contact pad, such as a bond finger pad, it can prevent electrical contact with the pad or cause mechanical problems. One conventional solution uses a dam fabricated from solder mask material in an attempt to constrain the flow of the underfill material. A conventional system using a dam also may be supplemented by having exposed electrical contact pads placed up to 200 microns away from the dam thereby creating an amount of clearance for the liquid underfill to traverse should the liquid underfill flow over the dam. Another conventional system uses a trench to slow the flow of underfill. However, it would be desirable to develop more effective techniques to control the flow of underfill material.

BRIEF SUMMARY

According to one embodiment, a packaging system for preventing underfill overflow comprises a package substrate having a solder mask and a die attach site, a solder mask dam on the solder mask proximal to the die attach site, and a trench in the solder mask proximal to the die attach site. The trench and the solder mask dam are adapted to constrain flow of an underfill material.

According to another embodiment, a method for manufacturing a semiconductor die package comprises fabricating a package substrate having a solder mask and a die attach site, disposing a solder mask dam on the solder mask proximal to the die attach site, and fabricating a trench in the solder mask proximal to the die attach site. The trench and the solder mask dam are adapted to constrain flow of an underfill material.

In another embodiment, a packaging system comprises a package substrate having a solder mask and a die attach site. The packaging system further comprises means for obstructing a flow of underfill material, where the obstructing means is disposed on the solder mask proximal to the die attach site. The packaging system further comprises means for slowing the flow of the underfill material, where the slowing means is proximal to the die attach site.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
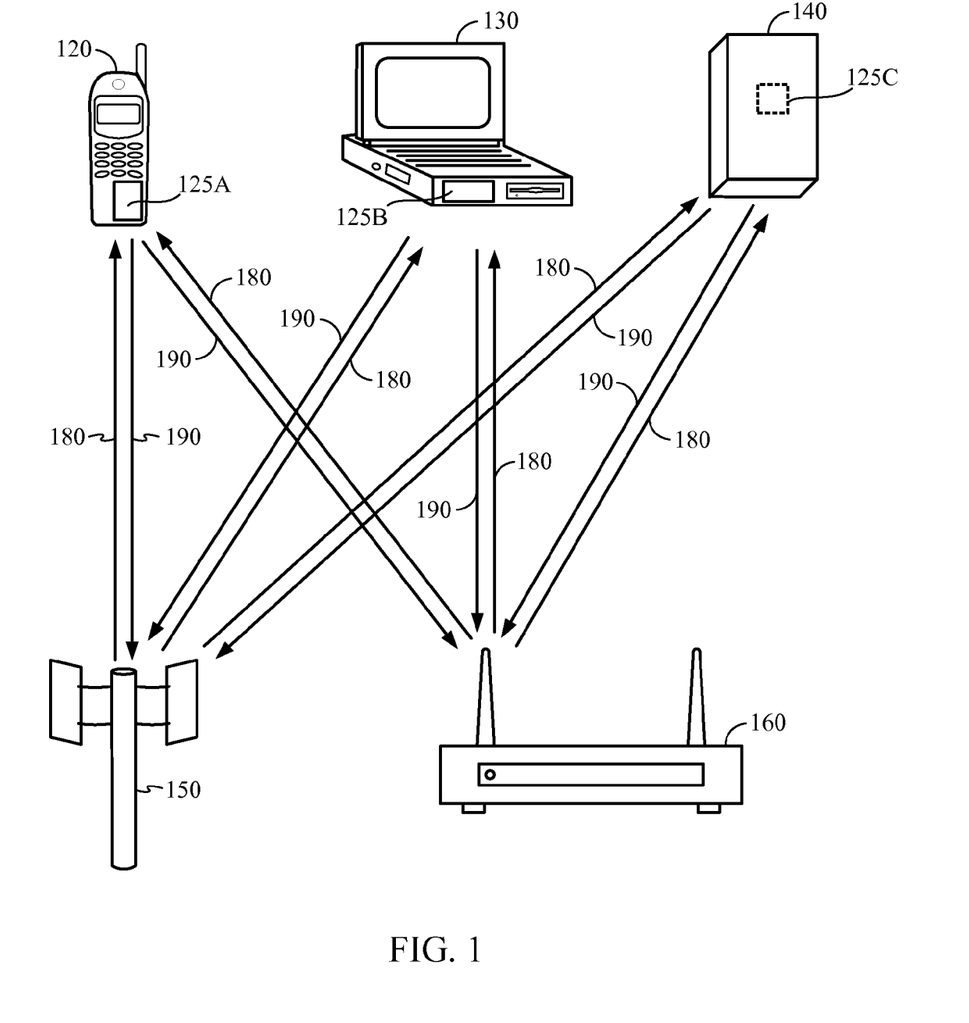
FIG. 1 is a block diagram showing an exemplary wireless communication system in which an embodiment of the disclosure may be advantageously employed.

FIG. 1 shows an exemplary wireless communication system 100 in which an embodiment of the disclosure may be advantageously employed. For purposes of illustration, FIG. 1 shows three remote units 120, 130, and 140 and two base stations 150, 160. It will be recognized that wireless communication systems may have many more remote units and base stations. The remote units 120, 130, and 140 include improved semiconductor chip packages 125A, 125B, and 125C, respectively, such as the semiconductor chip packages discussed in more detail below. FIG. 1 shows the forward link signals 180 from the base stations 150, 160 and the remote units 120, 130, and 140 and the reverse link signals 190 from the remote units 120, 130, and 140 to base stations 150, 160.

In FIG. 1, the remote unit 120 is shown as a mobile telephone, the remote unit 130 is shown as a portable computer, and the remote unit 140 is shown as a computer in a wireless local loop system. For example, the remote unit 120 may include mobile devices, such as cell phones, hand-held personal communication systems (PCS) units, portable data units such as personal data assistants. The remote unit 120 may also include fixed location data units such as meter reading equipment. Although FIG. 1 illustrates remote units according to the teachings of the disclosure, the disclosure is not limited to these exemplary illustrated units. The disclosure may be suitably employed in any device which includes a semiconductor chip package.

Figure 2:
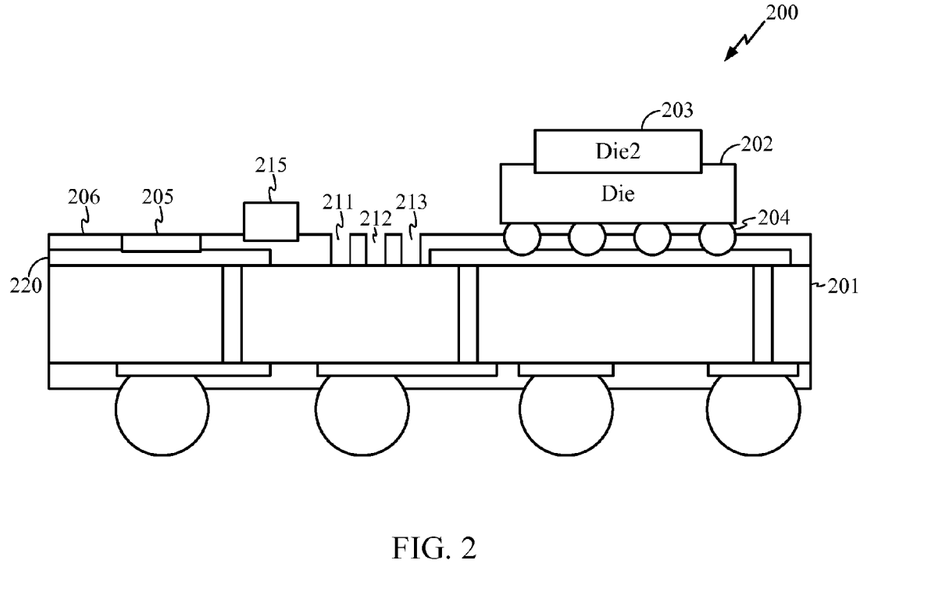
FIG. 2 is an illustration of an exemplary semiconductor chip package adapted according to one embodiment of the disclosure.

FIG. 2 is an illustration of an exemplary semiconductor chip package 200 adapted according to one embodiment of the disclosure. The semiconductor chip package 200 includes a package substrate 201, semiconductor dies 202 and 203, which are stacked, and a solder mask 206. The semiconductor die 202 is coupled to the package substrate 201 using a ball grid array 204. The chip package substrate 201 also includes an exposed electrical contact pad, in this example, the bond finger pad 205, which provides electrical communication with the conductive material 220. The bond finger pad 205 can be employed, for example, to make an electrical communication path from the semiconductor die 203 to the conductive material 220 using bond wires (not shown). Exposed electrical contact pads can be employed for any of a variety of uses in various embodiments, including for providing an electrical coupling to a resistor, a capacitor, an inductor, a balun component, and/or the like.

Although not shown in FIG. 2 for simplicity, underfill material may be applied to the semiconductor die 202 to provide mechanical and thermal support. In the embodiment of FIG. 2, trenches 211, 212, 213 and a solder mask dam 215 are used to constrain the flow of the underfill material so that the underfill material does not flow onto the exposed bond finger pad 205. Specifically, the trenches 211, 212, and 213 slow the flow of the underfill material and trap more of the underfill material before it reaches the solder mask dam 215, and the solder mask dam 215 obstructs the flow of the underfill material. In this example, the trenches 211, 212, 213 and the dam 215 are solder mask structures and, accordingly, are formed of solder mask material. The trenches 211, 212, 213 are etched into a layer of solder mask material on the package substrate 201, and the solder mask dam 215 is formed by an additional layer of solder mask material. Fabrication of semiconductor chip packages is discussed in more detail with respect to FIG. 8.

Figure 3:
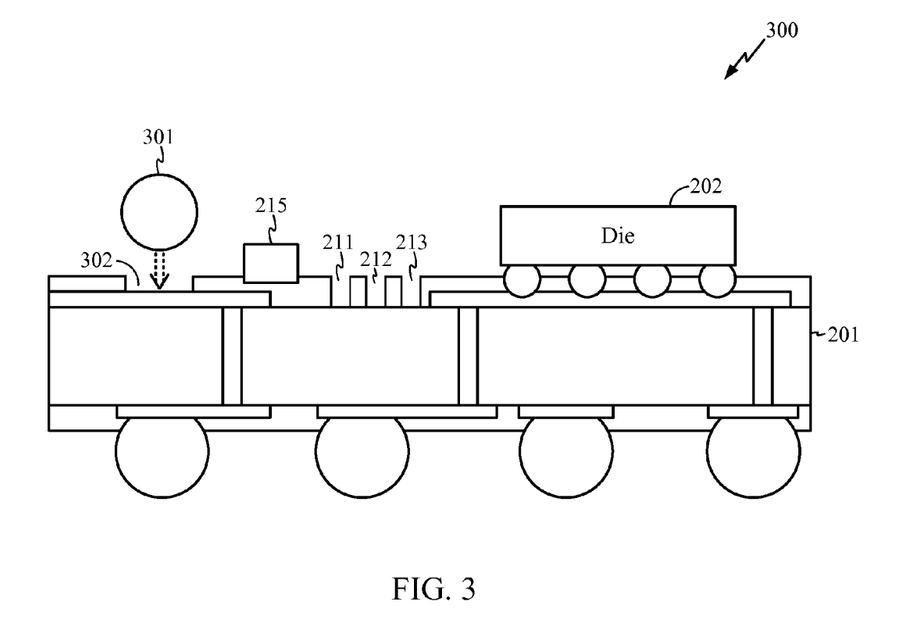
FIG. 3 is an illustration of an exemplary semiconductor chip package adapted according to one embodiment of the disclosure.

The embodiment of FIG. 2 is one embodiment, and the scope of embodiments includes a variety of other structures. For instance, FIG. 3 is an illustration of an exemplary semiconductor chip package 300 adapted according to one embodiment of the disclosure. The embodiment of FIG. 3 is similar to that of FIG. 2, but the semiconductor chip package 300 includes a package-on-package ball 301 that is disposed in a ball pad opening 302, rather than the bond finger pad 205. FIG. 3 shows the package-on-package ball 301 before it is disposed in the ball pad opening 302. The solder mask dam 215 and the trenches 211, 212, 213 constrain the flow of the underfill material so that the underfill material does not interfere with the ball pad opening 302 before the package-on-package ball 301 is disposed in the ball pad opening 302. When underfill material interferes with the ball pad opening 302, the electrical contact of the package-on-package ball 301 may be compromised. The ball pad opening 302 of FIG. 3 and the bond finger pad 205 of FIG. 2 are only two examples of electrical contact structures that may be used in various embodiments benefiting from more effective underfill material containment, and the scope of embodiments is not limited to any specific type of exposed electrical contact structure. For instance, other embodiments may include Surface Mount Technology (SMT) component pads, and such embodiments may benefit from the use of dam and trench structures.

Figure 4:
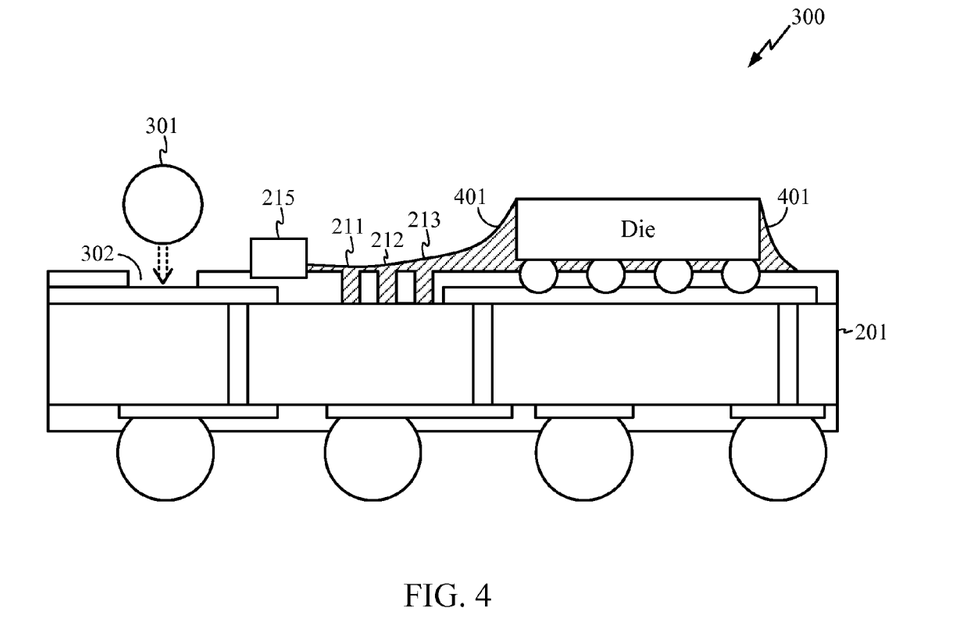
FIG. 4 is an illustration of the exemplary semiconductor chip package of FIG. 3, including underfill material.

FIG. 4 is an illustration of the exemplary semiconductor chip package 300, adapted according to one embodiment of the disclosure, and including underfill material 401. FIG. 4 shows one example of the trenches 211, 212, 213 and the solder mask dam 215 constraining a flow of the underfill material 401. In this example, the underfill material 401 is slowed as it fills in the trenches 211, 212, 213 and stopped by the solder mask dam 215. The trenches 211, 212, 213 provide extra volume to accommodate at least some of the underfill material 401 as it flows over the surface of the chip package 300. The extra volume traps some of the underfill material 401 before the underfill material 401 reaches the solder mask dam 215. The solder mask dam 215 obstructs the remaining underfill material 401 before it flows onto the ball pad opening 302.

Figure 5:
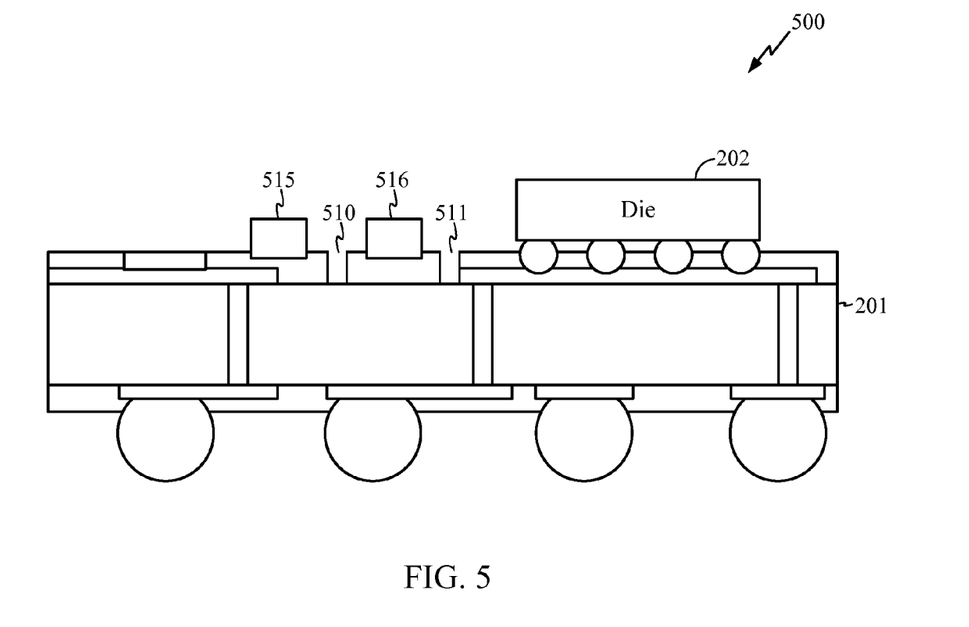
FIG. 5 is an illustration of an exemplary semiconductor chip package adapted according to one embodiment of the disclosure.

FIG. 5 is an illustration of an exemplary semiconductor chip package 500 adapted according to one embodiment of the disclosure. The semiconductor chip package 500 includes two trenches 510, 511 and two dams 515, 516. FIG. 5, as well as other FIGURES described below, are offered to illustrate that embodiments are not limited to any specific number of dams or trenches, and the numbers of dams and trenches can be adapted to a specific application.

Figure 6:
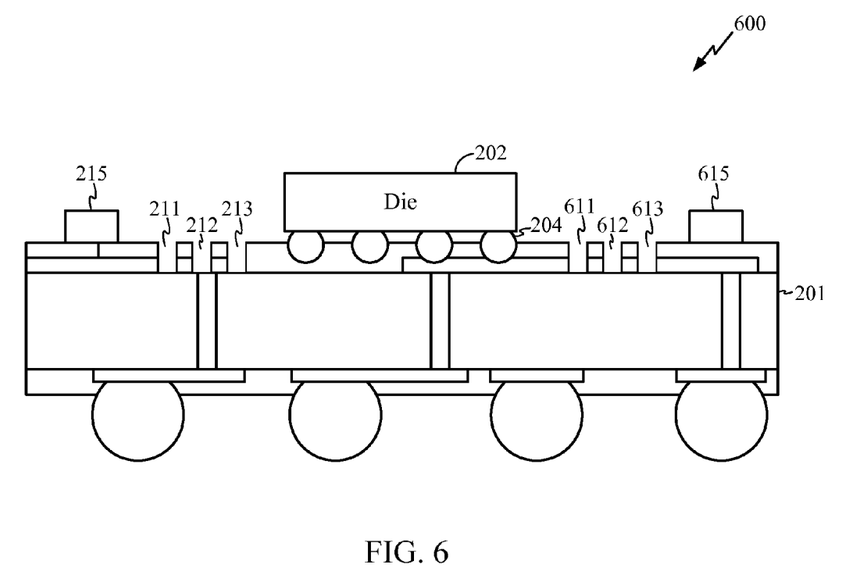
FIG. 6 is an illustration of an exemplary semiconductor chip package adapted according to one embodiment of the disclosure.

FIG. 6 is an illustration of an exemplary semiconductor chip package 600 adapted according to one embodiment of the disclosure. The semiconductor chip package 600 includes the solder mask dam 215 and the trenches 211, 212, 213 and also includes the solder mask dam 615 and the trenches 611, 612, and 613. FIG. 6 illustrates that any side of the die attach site (i.e., the contact site on the package substrate 201 to which the ball grid array 204 is coupled) can be enclosed wholly or partially by trench and/or dam structures. In various embodiments, the die attach site is at least partially surrounded by trench and dam structures to constrain the flow of underfill material.

Figure 7:
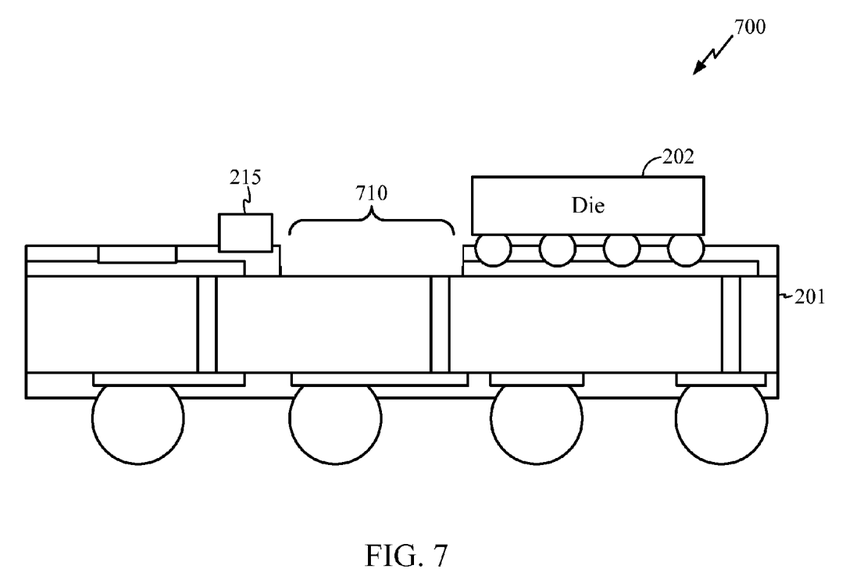
FIG. 7 is an illustration of an exemplary semiconductor chip package adapted according to one embodiment of the disclosure.

FIG. 7 is an illustration of an exemplary semiconductor chip package 700 adapted according to one embodiment of the disclosure. The semiconductor chip package 700 includes a large trench 710, which may be several times wider than the various respective trenches of FIGS. 2-6. FIG. 7 illustrates that embodiments may include trenches of any size that can be accommodated on a particular package. Furthermore, various embodiments may include narrow trenches as well as wide trenches.

Figure 8:
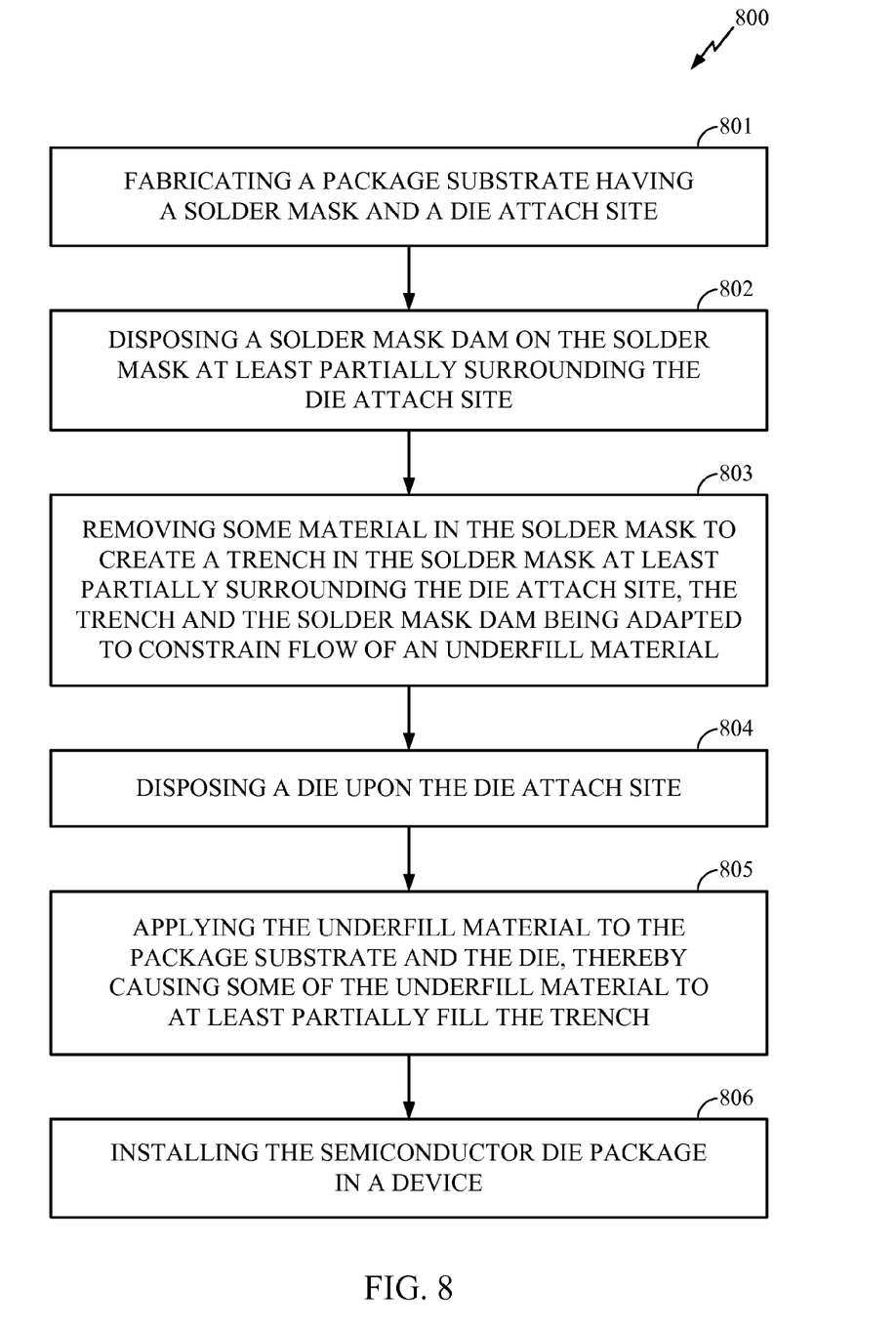
FIG. 8 is an illustration of the exemplary method for manufacturing a semiconductor chip package according to one embodiment of the disclosure.

FIG. 8 is an illustration of an exemplary method 800 for manufacturing a semiconductor chip package according to one embodiment of the disclosure. The various actions of the method 800 may be performed at one or more sites by one or more entities.

In block 801, a package substrate having a solder mask and a die attach site is fabricated. The package substrate, solder mask, and die attach site can be fabricated using conventional fabrication processes or other processes now known or later developed. Examples of types of solder masks that can be used include epoxies and liquid photoimageable materials, though the scope of embodiments is not limited to any particular material for the solder mask.

In block 802, a solder mask dam is disposed on the solder mask proximal to the die attach site. In block 803, some material in the solder mask is removed to create a trench in the solder mask proximal to the die attach site. The trench can be created using any of a variety of processes, such as Ultra Violet (UV) exposure or solvent etching.

In block 804, a die is disposed upon the die attach site. In one example, the die attach site includes an array of contacts that are aligned with balls of a ball grid array on the die. Once aligned, the ball grid array is reflowed. Other dies may be stacked, as well, such as wire-bond dies. The scope of embodiments is not limited to use of flip chip ball grid array dies, as any structure inviting use of an underfill material may be included in various embodiments.

In block 805, underfill material is applied to the package substrate and the die, thereby causing some of the underfill material to at least partially fill the trench. An example of a type of material that can be used for underfill is epoxy, though the scope of embodiments is not limited by the type of underfill used. The trench and the solder mask dam constrain the flow of the underfill material. In block 806, the semiconductor chip package is installed in a device, such as a music player, a video player, an entertainment unit, a navigation device, a communications device, a personal digital assistant (PDA), a fixed location data unit, a computer, or the like.

While the method 800 is shown a series of discrete actions, the scope of embodiments is not so limited. Various embodiments may add, omit, rearrange, or modify one or more actions. For instance, some embodiments may include building a larger package-on-package structure using the semiconductor chip package. Furthermore, the actions of block 803 may be performed before the actions of block 802 in some embodiments. Moreover, the actions of blocks 804, 805, and 806 are not performed in some embodiments. Additionally, other embodiments may include fabricating more trenches and/or dam structures.

Various embodiments may include one or more advantages over conventional technologies. For instance, supplementing a dam structure with a trench structure reduces the chance of underfill overflow when compared to conventional solutions using only a dam or a trench. Furthermore, some embodiments using a dam and a trench can be made smaller than comparable embodiments using only a dam. Such embodiments using only a dam sometimes include a clearance distance between the dam and an electrical contact (e.g., an exposed contact pad) just in case the underfill overflows the dam. In some embodiments that employ both a dam and a trench, the clearance distance between the dam and an electrical contact can be reduced out of an expectation that the underfill will not overflow, and smaller clearances can lead to smaller packages.

Although specific circuitry has been set forth, it will be appreciated by those skilled in the art that not all of the disclosed circuitry is required to practice the disclosure. Moreover, certain well known circuits have not been described, to maintain focus on the disclosure.

The methodologies described herein may be implemented by various components depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor chip package, comprising:
a package substrate having a die attach site;
a solder mask on the package substrate; and
a dam on the solder mask,
wherein the solder mask defines a plurality of trenches located closer to the die attach site than the dam, and at least a portion of the dam is on a layer further from the package substrate than the plurality of trenches.

2. The semiconductor chip package of claim 1, further comprising a semiconductor die mounted on the die attach site.

3. The semiconductor chip package of claim 1, further comprising a pad on the package substrate, wherein the solder mask defines an opening in the solder mask that exposes the pad, and both the dam and the plurality of trenches are located closer to the die attach site than to the opening.

4. The semiconductor chip package of claim 1, further comprising underfill material located in at least one trench in the plurality of trenches.

5. The semiconductor chip package of claim 1, further comprising a package-on-package ball on the package substrate, wherein both the dam and the plurality of trenches are located closer to the die attach site than to the package-on-package ball.

6. A semiconductor chip package, comprising:
a package substrate having a die attach site;
a solder mask on the package substrate;
means for obstructing a flow of underfill material, wherein the obstructing means is formed on the solder mask; and
first and second means for receiving therein the flow of the underfill material, wherein the first and second means are located closer to the die attach site than the obstructing means, and at least a portion of the obstructing means is on a layer further form the package substrate than the first and second means.

7. The semiconductor chip package, of claim 6, further comprising an electrical contact pad on the package substrate, wherein both the obstructing means and the first and second means are closer to the die attach site than to the electrical contact pad.

8. The semiconductor chip package, of claim 6, further comprising underfill material located in at least one of the first and second means.

9. The semiconductor chip package, of claim 6, further comprising a package-on-package ball on the package substrate, wherein both the obstructing means and the first and second means are located closer to the die attach site than to the package-on-package ball.

10. The semiconductor chip package of claim 6, further comprising a semiconductor die mounted on the die attach site.

11. An apparatus, comprising:
an electronic device comprising at least one of a music player, a video player, an entertainment unit, a navigation device, a communications device, a personal digital assistant (PDA), a fixed location data unit, or a computer;
a semiconductor chip package integrated in the electronic device, and comprising:
a package substrate having a die attach site;
a solder mask on the package substrate; and
a dam on the solder mask,
wherein the solder mask defines a plurality of trenches, located between the dam and the die attach site, and at least a portion of the dam is on a different layer than the plurality of trenches.

12. An apparatus, comprising:
an electronic device comprising at least one of a music player, a video player, an entertainment unit, a navigation device, a communications device, a personal digital assistant (PDA), a fixed location data unit, or a computer;
a semiconductor chip package integrated in the electronic device, and comprising:
a package substrate having a die attach site;
a solder mask on the package substrate;
means for obstructing a flow of underfill material, wherein the obstructing means is formed on the solder mask; and
first and second means for receiving therein the flow of the underfill material, wherein the first and second means are located closer to the die attach site than the obstructing means, and at least a portion of the obstructing means is on a different layer than the first and second means.

* * * * *